(12) United States Patent
Sai

(10) Patent No.: US 11,594,530 B2
(45) Date of Patent: Feb. 28, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hideaki Sai, Ibo Hyogo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/936,115

(22) Filed: Jul. 22, 2020

(65) Prior Publication Data
US 2021/0296305 A1  Sep. 23, 2021

(30) Foreign Application Priority Data
Mar. 17, 2020  (JP) .............................. JP2020-046038

(51) Int. Cl.
  *H01L 27/02* (2006.01)
  *H01L 29/866* (2006.01)
  *H01L 27/08* (2006.01)

(52) U.S. Cl.
  CPC ...... *H01L 27/0255* (2013.01); *H01L 27/0296* (2013.01); *H01L 27/0814* (2013.01); *H01L 29/866* (2013.01)

(58) Field of Classification Search
  None
  See application file for complete search history.

(56) References Cited

U.S. PATENT DOCUMENTS

| 6,441,437 B1 | 8/2002 | Gossner | |
| 8,431,958 B2* | 4/2013 | Bobde | H01L 27/0814 257/173 |
| 8,841,741 B2* | 9/2014 | Kamaga | H01L 29/0615 257/458 |
| 9,711,499 B2* | 7/2017 | Sai | H01L 27/0814 |
| 9,825,019 B1* | 11/2017 | Sai | H01L 27/0255 |
| 2016/0093605 A1 | 3/2016 | Sai | |

FOREIGN PATENT DOCUMENTS

| JP | 2001-518714 A | 10/2001 |
| JP | 5439417 B2 | 3/2014 |
| JP | 2016-072259 A | 5/2016 |
| JP | 6266485 B2 | 1/2018 |
| JP | 6532848 B2 | 6/2019 |

* cited by examiner

*Primary Examiner* — Steven M Christopher
(74) *Attorney, Agent, or Firm* — Kim & Stewart LLP

(57) ABSTRACT

An eighth semiconductor portion is provided between the first semiconductor portion and the third semiconductor portion. The eighth semiconductor portion is of the second conductivity type, contacting the first semiconductor portion, and having a lower second-conductivity-type impurity concentration than the second semiconductor portion.

15 Claims, 5 Drawing Sheets

US 11,594,530 B2

SEMICONDUCTOR DEVICE

CROSS-REFERENCE TO RELATED APPLICATION

This application is based upon and claims the benefit of priority from Japanese Patent Application No. 2020-046038, filed on Mar. 17, 2020; the entire contents of which are incorporated herein by reference.

FIELD

Embodiments described herein relate generally to a semiconductor device.

BACKGROUND

Generally, an ESD (Electro Static Discharge) protection diode that has a small product capacitance of, for example, less than 1 pF includes a crowbar circuit in which two switching diodes and one zener diode are combined. The breakdown voltage of a product having such a structure is set by adjusting the breakdown voltage of the zener diode. Generally, the ESD immunity undesirably decreases as the breakdown voltage of a diode increases because the power after the breakdown increases. On the other hand, it is desirable to reduce the clamping voltage of the ESD protection diode as the IC (Integrated Circuit) to be protected is downscaled. Although a snapback operation is effective to reduce the clamping voltage, a large voltage is applied to the zener diode directly after the snapback start because the snapback-start voltage is greater than the breakdown voltage. In other words, when combining a snapback operation with a higher breakdown voltage of the product, a larger voltage is applied to the zener diode at snapback start, and there is a risk of breakdown occurring even for a small current after snapback because the power per unit area is large.

DETAILED DESCRIPTION

Figure 1A:
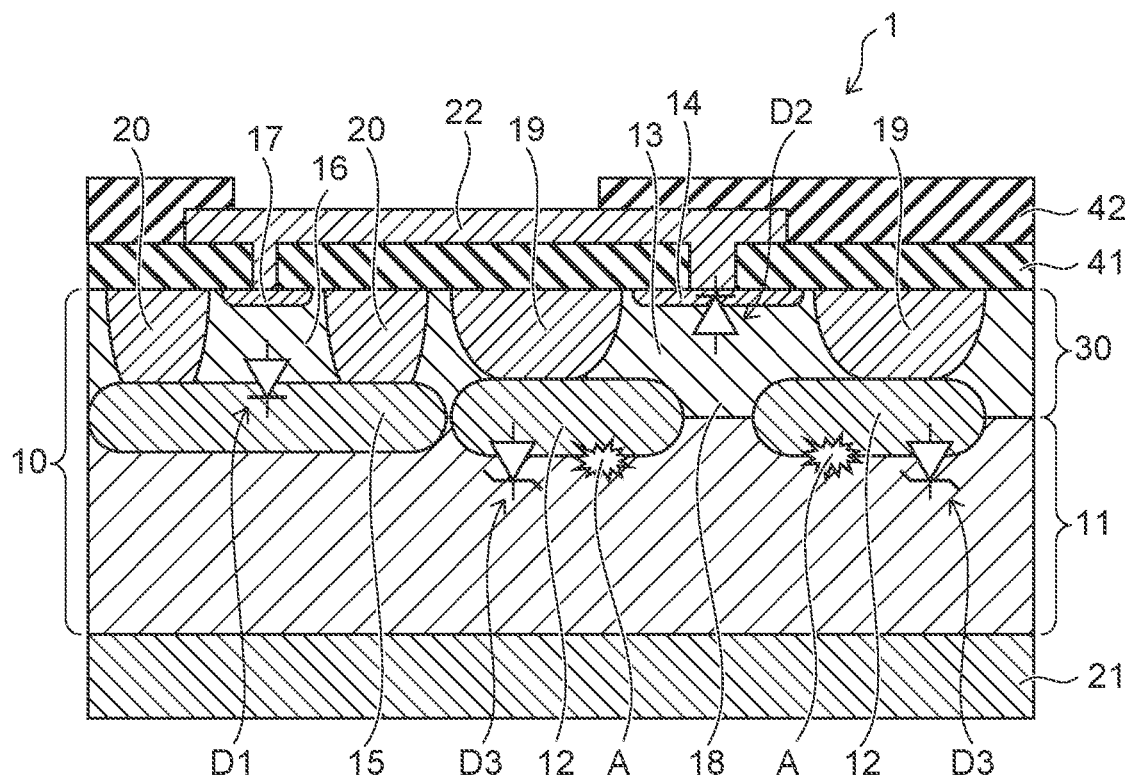
FIG. 1A is a schematic cross-sectional view of a semiconductor device of an embodiment.

According to one embodiment, a semiconductor device includes a first semiconductor portion of a first conductivity type; a second semiconductor portion provided on the first semiconductor portion, the second semiconductor portion being of a second conductivity type and contacting the first semiconductor portion; a third semiconductor portion provided on the first semiconductor portion, the third semiconductor portion being of the second conductivity type and having a lower second-conductivity-type impurity concentration than the second semiconductor portion; a fourth semiconductor portion provided on the third semiconductor portion, the fourth semiconductor portion being of the first conductivity type and contacting the third semiconductor portion; a fifth semiconductor portion provided on the first semiconductor portion, the fifth semiconductor portion being of the first conductivity type; a sixth semiconductor portion provided on the fifth semiconductor portion, the sixth semiconductor portion being of the second conductivity type and contacting the fifth semiconductor portion; a seventh semiconductor portion provided on the sixth semiconductor portion, the seventh semiconductor portion being of the second conductivity type and having a higher second-conductivity-type impurity concentration than the sixth semiconductor portion; an eighth semiconductor portion provided between the first semiconductor portion and the third semiconductor portion, the eighth semiconductor portion being of the second conductivity type, contacting the first semiconductor portion, and having a lower second-conductivity-type impurity concentration than the second semiconductor portion; a first electrode contacting the first semiconductor portion; and a second electrode contacting the fourth semiconductor portion and the seventh semiconductor portion.

Embodiments will now be described with reference to the drawings. The same components in the drawings are marked with the same reference numerals.

Although a first conductivity type is taken to be an N-type and a second conductivity type is taken to be a P-type in the description of the following embodiments, the first conductivity type may be the P-type, and the second conductivity type may be the N-type. Although a semiconductor material is taken to be silicon in the following embodiments, the semiconductor material is not limited to silicon and may be, for example, silicon carbide, gallium nitride, etc.

Figure 1B:
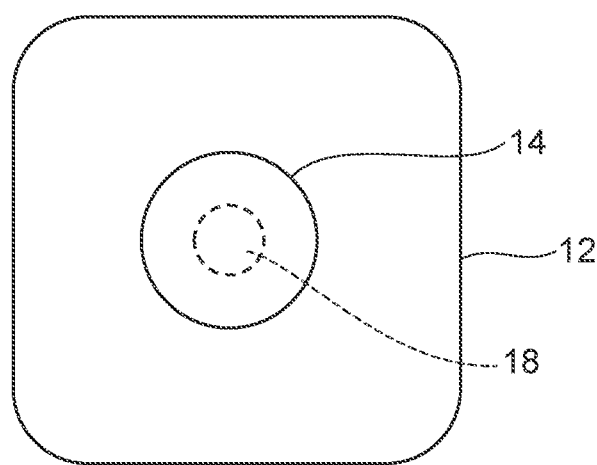
FIG. 1B is a schematic plan view of a second semiconductor portion, a fourth semiconductor portion, and an eighth semiconductor portion of FIG. 1A.

FIG. 1A is a schematic cross-sectional view of a semiconductor device 1 of an embodiment. FIG. 1B is a schematic plan view of a second semiconductor portion 12, a fourth semiconductor portion 14, and an eighth semiconductor portion 18 of FIG. 1A.

The semiconductor device 1 includes a semiconductor layer 10, a first electrode 21, a second electrode 22, an insulating film 41, and a protective film 42.

The semiconductor layer 10 includes a semiconductor layer 30, a first semiconductor portion 11, the second semiconductor portion 12, a third semiconductor portion 13, the fourth semiconductor portion 14, a fifth semiconductor portion 15, a sixth semiconductor portion 16, a seventh semiconductor portion 17, the eighth semiconductor portion 18, a ninth semiconductor portion 19, and a tenth semiconductor portion 20.

The P-type semiconductor layer 30 is provided on the N-type first semiconductor portion 11. For example, the first semiconductor portion 11 is a semiconductor substrate, and the semiconductor layer 30 is epitaxially grown on the first semiconductor portion 11. The semiconductor layer 30 includes the third semiconductor portion 13, the eighth semiconductor portion 18, and the sixth semiconductor portion 16.

The P-type second semiconductor portion 12 is provided on the first semiconductor portion 11. The bottom portion of the second semiconductor portion 12 contacts the first semiconductor portion 11; and the second semiconductor portion 12 and the first semiconductor portion 11 form a P-N junction.

The P-type third semiconductor portion 13, which is a portion of the semiconductor layer 30, is provided on the first semiconductor portion 11. The P-type impurity concentration of the third semiconductor portion 13 is less than the P-type impurity concentration of the second semiconductor portion 12.

The N-type fourth semiconductor portion 14 is provided on the third semiconductor portion 13 and contacts the third semiconductor portion 13. The third semiconductor portion 13 and the fourth semiconductor portion 14 form a P-N junction.

The N-type fifth semiconductor portion 15 is provided on the first semiconductor portion 11. The N-type impurity concentration of the fifth semiconductor portion 15 is less than the N-type impurity concentration of the first semiconductor portion 11. The fifth semiconductor portion 15 is positioned at substantially the same depth as the second semiconductor portion 12.

The P-type sixth semiconductor portion 16, which is a portion of the semiconductor layer 30, is provided on the fifth semiconductor portion 15. The sixth semiconductor portion 16 contacts the fifth semiconductor portion 15; and the sixth semiconductor portion 16 and the fifth semiconductor portion 15 form a P-N junction.

The P-type seventh semiconductor portion 17 is provided on the sixth semiconductor portion 16. The P-type impurity concentration of the seventh semiconductor portion 17 is greater than the P-type impurity concentration of the sixth semiconductor portion 16.

The P-type eighth semiconductor portion 18, which is a portion of the semiconductor layer 30, is provided between the first semiconductor portion 11 and the third semiconductor portion 13. The P-type impurity concentration of the eighth semiconductor portion 18 is less than the P-type impurity concentration of the second semiconductor portion 12. The eighth semiconductor portion 18 contacts the first semiconductor portion 11; and the eighth semiconductor portion 18 and the first semiconductor portion 11 form a P-N junction.

The third semiconductor portion 13 and the eighth semiconductor portion 18 are provided under the fourth semiconductor portion 14. The third semiconductor portion 13 is provided between the fourth semiconductor portion 14 and the eighth semiconductor portion 18, and the eighth semiconductor portion 18 is provided between the third semiconductor portion 13 and the first semiconductor portion 11. The eighth semiconductor portion 18 is at a position overlapping the fourth semiconductor portion 14 in the thickness direction of the semiconductor layer 30.

The P-type ninth semiconductor portion 19 is provided on the second semiconductor portion 12. The ninth semiconductor portion 19 surrounds the periphery of the third semiconductor portion 13 and the periphery of the fourth semiconductor portion 14 and separates the third and fourth semiconductor portions 13 and 14 from the other regions of the semiconductor layer 30. The P-type impurity concentration of the ninth semiconductor portion 19 is greater than the P-type impurity concentration of the third semiconductor portion 13 and the P-type impurity concentration of the eighth semiconductor portion 18.

The N-type tenth semiconductor portion 20 is provided on the fifth semiconductor portion 15. The tenth semiconductor portion 20 surrounds the periphery of the sixth semiconductor portion 16 and the periphery of the seventh semiconductor portion 17 and separates the sixth and seventh semiconductor portions 16 and 17 from the other regions of the semiconductor layer 30.

The first electrode 21 is provided at the lower surface of the first semiconductor portion 11. The first electrode 21 contacts the lower surface of the first semiconductor portion 11 and is electrically connected to the first semiconductor portion 11.

The insulating film 41 is provided at the upper surface of the semiconductor layer 30. The second electrode 22 is provided on the insulating film 41. The second electrode 22 contacts the fourth semiconductor portion 14 and the seventh semiconductor portion 17 via openings formed in the insulating film 41. The second electrode 22 is electrically connected to the fourth semiconductor portion 14 and the seventh semiconductor portion 17.

A portion of the second electrode 22 is covered with the protective film 42, and another portion of the second electrode is exposed from under the protective film 42. The protective film 42 is an insulating film. The portion of the second electrode 22 exposed from under the protective film 42 is electrically connected to an external circuit via a conductive connection member (e.g., a wire).

As shown in FIG. 1B, the periphery of the eighth semiconductor portion 18 is surrounded with the second semiconductor portion 12. For example, the second semiconductor portion 12 is formed by ion implantation after forming the semiconductor layer 30 on the first semiconductor portion 11. By not implanting the P-type impurity into the region used to form the eighth semiconductor portion 18 at this time, a portion that has a lower P-type impurity concentration than the second semiconductor portion 12 remains at a portion of the junction portion between the semiconductor layer 30 and the first semiconductor portion 11 and is used to form the eighth semiconductor portion 18.

The semiconductor device 1 includes a first diode D1, a second diode D2, and a third diode D3. The first diode D1 includes a P-N junction between the P-type sixth semiconductor portion 16 and the N-type fifth semiconductor portion 15. The second diode D2 includes a P-N junction between the P-type third semiconductor portion 13 and the N-type fourth semiconductor portion 14. The third diode D3 includes a P-N junction between the P-type second semiconductor portion 12 and the N-type first semiconductor portion 11.

The eighth semiconductor portion 18 is positioned directly under the second diode D2. The contact area (the surface area of the P-N junction) between the eighth semiconductor portion 18 and the first semiconductor portion 11 is less than the contact area (the surface area of the P-N junction of the third diode D3) between the second semiconductor portion 12 and the first semiconductor portion 11.

Figure 2A:
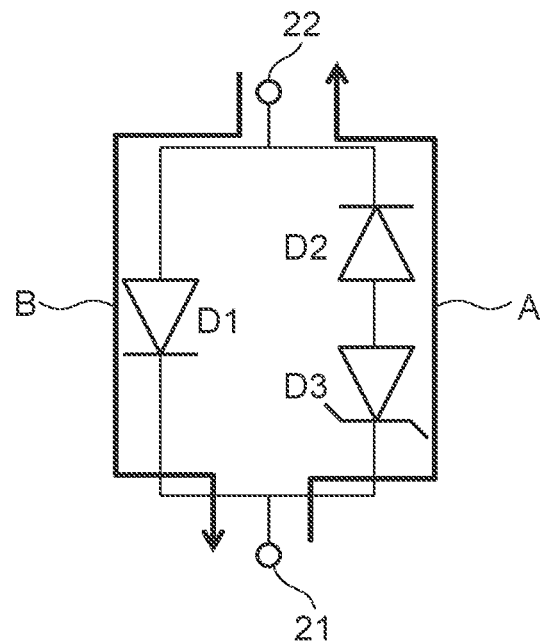
FIG. 2A is an equivalent circuit diagram of the semiconductor device of the embodiment.

FIG. 2A is an equivalent circuit diagram of the semiconductor device of the embodiment.

The first diode D1 and the second diode D2 are switching diodes, and the third diode D3 is a zener diode. The second diode D2 and the third diode D3 are connected in series between the first electrode 21 and the second electrode 22. The first diode D1 and a set of diodes including the second and third diodes D2 and D3 are connected in parallel between the first electrode 21 and the second electrode 22. The anode of the first diode D1 is connected to the second electrode 22, and the cathode of the first diode D1 is connected to the first electrode 21. The cathode of the second diode D2 is connected to the second electrode 22. The cathode of the third diode D3 is connected to the first electrode 21. The anode of the second diode D2 and the anode of the third diode D3 are connected to each other.

The size of the third diode D3 is greater than the size of the first diode D1 and the size of the second diode D2. For example, the P-N junction area of the third diode D3 (the junction area between the second semiconductor portion 12 and the first semiconductor portion 11) is greater than the P-N junction area of the first diode D1 (the junction area between the sixth semiconductor portion 16 and the fifth semiconductor portion 15) and the P-N junction area of the second diode D2 (the junction area between the third semiconductor portion 13 and the fourth semiconductor portion 14). The capacitance of the third diode D3 is greater than the capacitance of the first diode D1 and the capacitance of the second diode D2. The ESD immunity of the third diode D3 is greater than the ESD immunity of the first diode D1 and the ESD immunity of the second diode D2.

The capacitance of the third diode D3 can be ignored because the capacitance of the third diode D3 is sufficiently greater than the capacitance of the second diode D2. Accordingly, the terminal-terminal capacitance of the crowbar circuit shown in FIG. 2A is represented by the sum of the capacitance of the first diode D1 and the capacitance of the second diode D2, which are small capacitances. Thereby, in the crowbar circuit, a lower capacitance can be realized while maintaining ESD immunity from the two directions of the forward and reverse directions.

The potential of the first electrode 21 is taken to be a ground potential. For example, when a negative transient voltage is applied to the second electrode 22, the second diode D2 is biased in the forward direction, the third diode D3 is biased in the reverse direction, and the first diode D1 is biased in the reverse direction. By setting the breakdown voltage of the third diode D3 to be less than the breakdown voltage of the first diode D1, a reverse current does not flow in the first diode D1, but a reverse current flows in the third diode D3. Thereby, the transient current (a surge current) flows toward the second electrode 22 from the first electrode 21 via the third diode D3 and the second diode D2 as illustrated by arrow A in FIG. 2A.

On the other hand, when a positive transient voltage is applied to the second electrode 22, the second diode D2 is biased in the reverse direction, the third diode D3 is biased in the forward direction, and the first diode D1 is biased in the forward direction. By setting the forward voltage of the first diode D1 to be less than the breakdown voltage of the second diode D2, the transient current flows to the first electrode 21 from the second electrode 22 via the first diode D1 as illustrated by arrow B in FIG. 2A.

Generally, the forward-direction ESD immunity of a diode is greater than its reverse-direction ESD immunity. In the crowbar circuit, for the first diode D1 and the second diode D2 which have low ESD immunity, the ESD flows only in the forward direction; for the third diode D3 which has high ESD immunity, the ESD flows in the reverse direction. Thereby, the ESD immunity is maintained for both forward-direction ESD and reverse-direction ESD.

A parasitic N-P-N transistor is embedded in the semiconductor device 1, in which the N-type fourth semiconductor portion 14 functions as an emitter, the P-type third semiconductor portion 13 and the P-type second semiconductor portion 12 function as a base, and the N-type first semiconductor portion 11 functions as a collector.

Figure 2B:
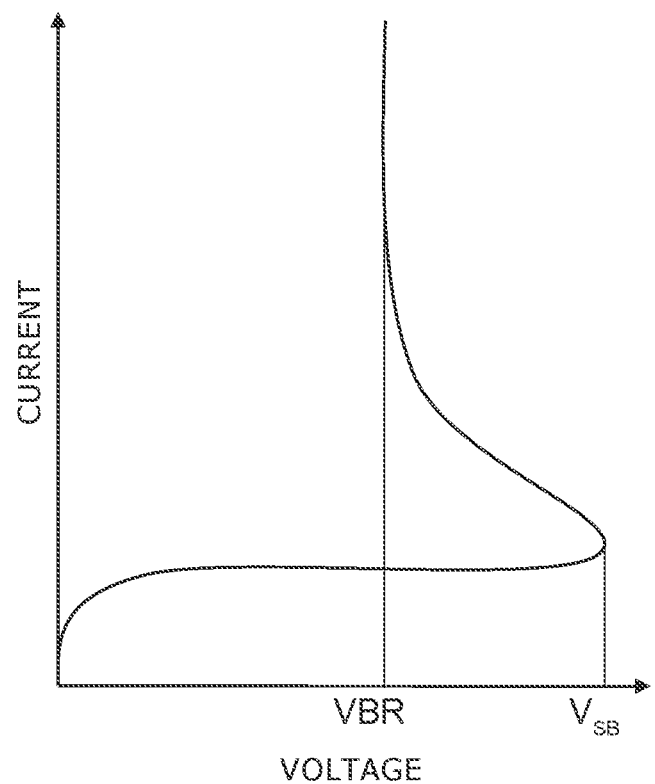
FIG. 2B is a current-voltage characteristic diagram of a third diode D3.

In the parasitic N-P-N transistor, when a voltage is applied between the emitter and the base and electrons are injected from the emitter into the base, there are cases where a base current flows and the N-P-N transistor is switched on before the breakdown of the third diode D3. In other words, as in the current-voltage characteristic of the third diode D3 shown in FIG. 2B, snapback occurs in which the voltage decreases once and the current increases before the breakdown of the third diode D3. At the horizontal axis in FIG. 2B, VBR is the breakdown voltage, and $V_{SB}$ is the snapback-start voltage.

To downscale ICs in recent years, it is necessary for the clamping voltage to be low when ESD is applied. In the semiconductor device 1, the parasitic N-P-N transistor operates at the snapback start, the carriers inside the semiconductor layer are increased, and the clamping voltage, i.e., the voltage that is applied to the ICs of subsequent stages, can be reduced.

Figure 5:
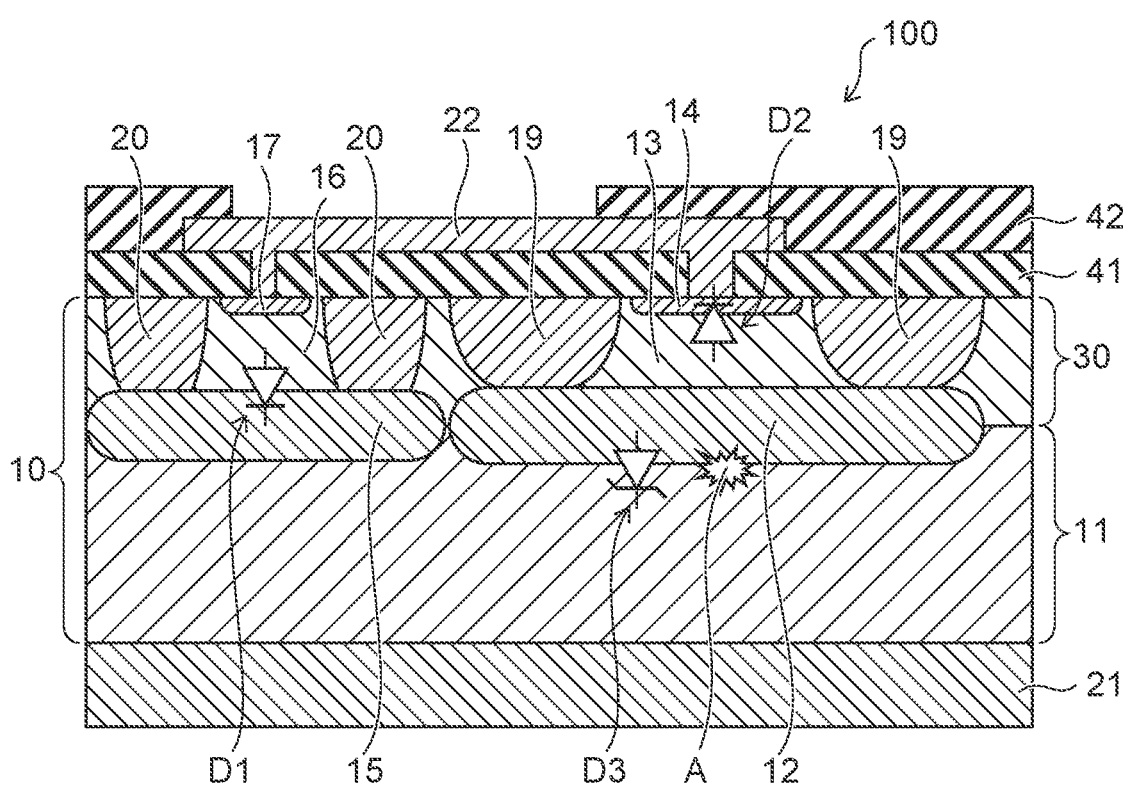
FIG. 5 is a schematic cross-sectional view of a semiconductor device of a comparative example.

FIG. 5 is a schematic cross-sectional view of a semiconductor device 100 of a comparative example. The semiconductor device 100 of the comparative example differs from the semiconductor device 1 of the embodiment in that the P-N junction of the third diode D3 (the junction between the second semiconductor portion 12 and the first semiconductor portion 11) is positioned directly under the second diode D2, and there is no eighth semiconductor portion 18 directly under the second diode D2.

In the semiconductor device 100 of the comparative example, the snapback operation starts earliest at a portion A directly under the second diode D2 at which the N-P-N distance of the parasitic N-P-N transistor is shortest. In other words, there is a risk that the current directly after the snapback start may concentrate at a point at the portion A, cause damage, and cause leakage breakdown with the damage as a starting point.

According to the semiconductor device 1 of the embodiment shown in FIGS. 1A and 1B, the third diode D3 is not formed directly under the second diode D2 where the N-P-N distance of the parasitic N-P-N transistor is shortest, and the eighth semiconductor portion 18 that has a lower P-type impurity concentration than the second semiconductor portion 12 of the third diode D3 is provided.

Thereby, the current directly after the snapback start can be prevented from concentrating at a point. ESD breakdown can be prevented because the current at the snapback start does not concentrate at a point and is dispersed in a line configuration along the portion A surrounding the eighth semiconductor portion 18 at the junction portion between the second semiconductor portion 12 and the first semiconductor portion 11, and the power per unit area does not become large.

Although the surface area of the third diode D3 (the junction area between the second semiconductor portion 12 and the first semiconductor portion 11) is reduced by the area where the eighth semiconductor portion 18 is formed, the ESD immunity of the semiconductor device 1 is substantially not affected because the ratio of the junction area between the eighth semiconductor portion 18 and the first semiconductor portion 11 to the surface area of the third diode D3 is small.

The P-type impurity concentration of the second semiconductor portion 12 is, for example, not less than $1 \times 10^{17}$ and not more than $1 \times 10^{19}$ (atoms/cm$^3$). Compared to the P-type impurity concentration of the second semiconductor portion 12, it is desirable for the P-type impurity concentration of the eighth semiconductor portion 18 to be not less than $5 \times 10^{13}$ and not more than $1 \times 10^{15}$ (atoms/cm$^3$).

Figure 3:
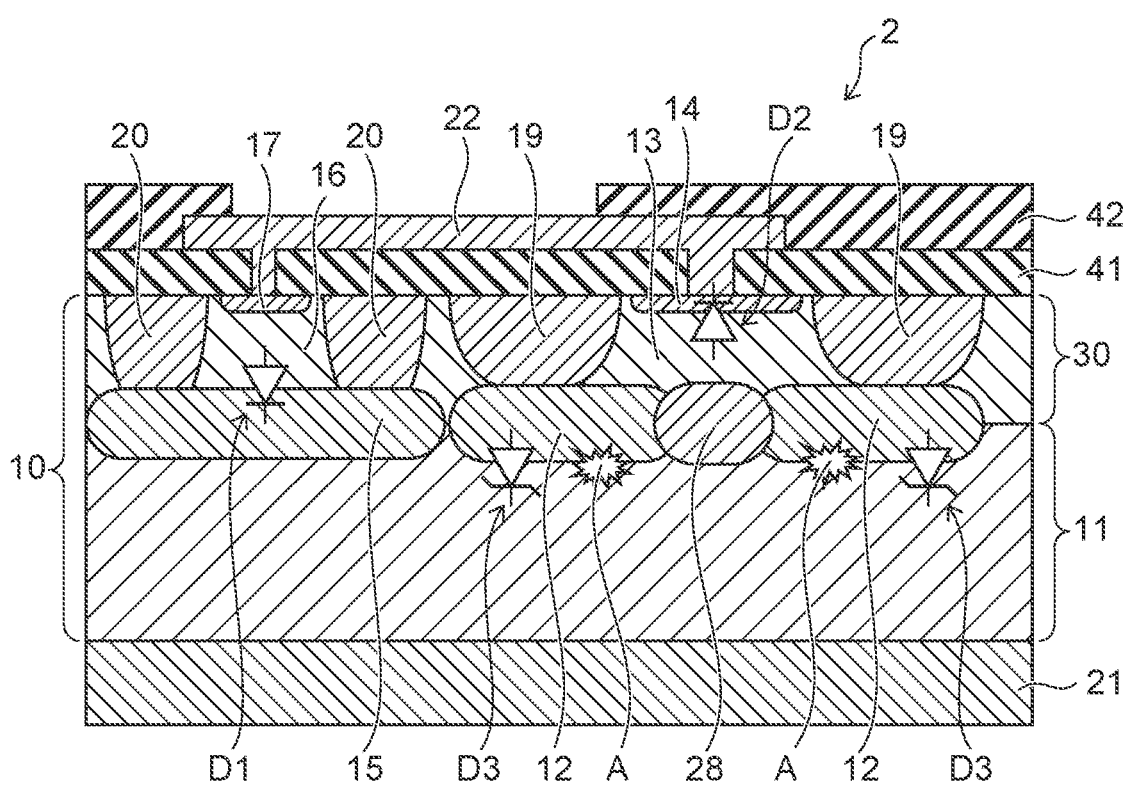
FIG. 3 is a schematic cross-sectional view of a semiconductor device of another embodiment.

FIG. 3 is a schematic cross-sectional view of a semiconductor device 2 of another embodiment.

The semiconductor device 2 includes an eighth semiconductor portion 28 instead of the eighth semiconductor portion 18 of the semiconductor device 1. The P-type eighth semiconductor portion 28 is provided between the first semiconductor portion 11 and the third semiconductor portion 13. The P-type impurity concentration of the eighth semiconductor portion 28 is less than the P-type impurity concentration of the second semiconductor portion 12. Also, the P-type impurity concentration of the eighth semiconductor portion 28 is greater than the P-type impurity concentration of the third semiconductor portion 13. The eighth semiconductor portion 28 contacts the first semiconductor portion 11; and the eighth semiconductor portion 28 and the first semiconductor portion 11 form a P-N junction. The eighth semiconductor portion 28 is at a position overlapping the fourth semiconductor portion 14 in the thickness direction of the semiconductor layer 30.

In the semiconductor device 2 as well, the third diode D3 is not formed directly under the second diode D2 where the N-P-N distance of the parasitic N-P-N transistor is shortest, and the eighth semiconductor portion 28 that has a lower P-type impurity concentration than the second semiconductor portion 12 of the third diode D3 is provided.

Thereby, the ESD breakdown can be prevented because the current at the snapback start does not concentrate at a point and is dispersed in a line configuration along the portion A surrounding the eighth semiconductor portion 28 at the junction portion between the second semiconductor portion 12 and the first semiconductor portion 11, and the power per unit area does not become large.

Figure 4:
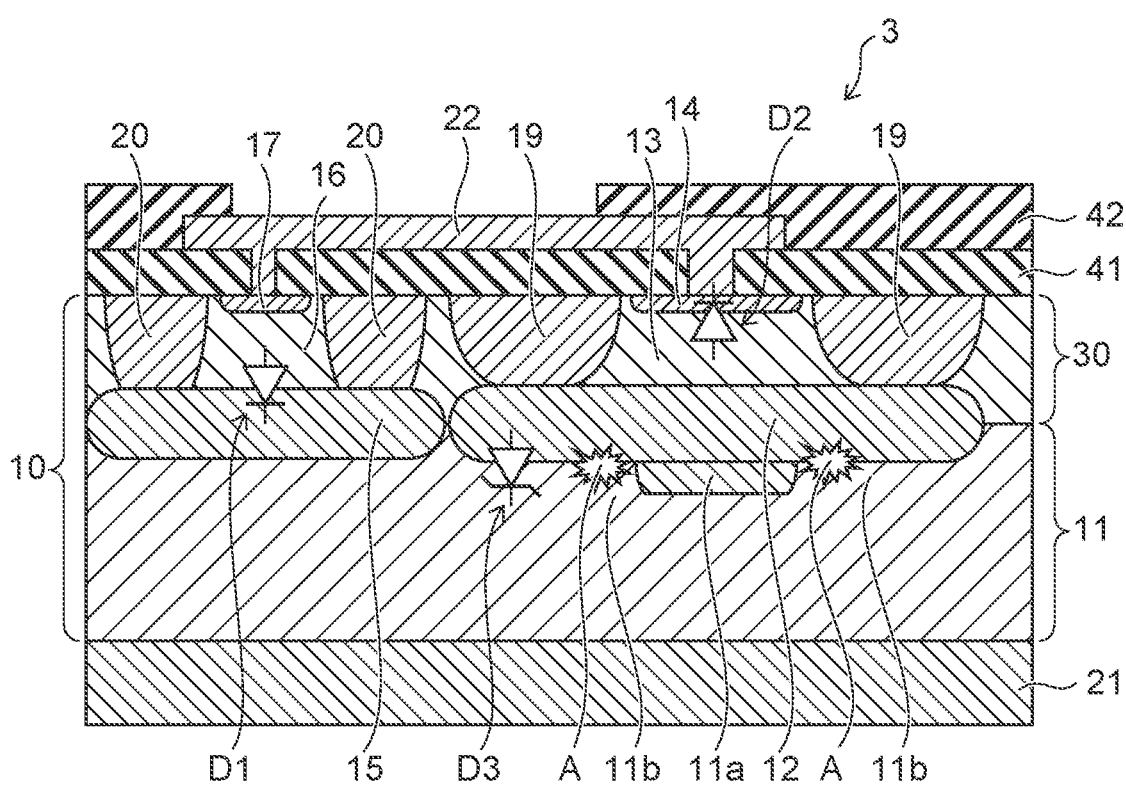
FIG. 4 is a schematic cross-sectional view of a semiconductor device of another embodiment.

FIG. 4 is a schematic cross-sectional view of a semiconductor device 3 of another embodiment.

The first semiconductor portion 11 includes a first portion 11a contacting the second semiconductor portion 12 under the fourth semiconductor portion 14, and a second portion 11b contacting the second semiconductor portion 12 at a region adjacent to the first portion 11a. The N-type impurity concentration of the first portion 11a is less than the N-type impurity concentration of the second portion 11b.

According to the semiconductor device 3, the impurity concentration of the P-N junction portion of the third diode D3, which is directly under the second diode D2 where the N-P-N distance of the parasitic N-P-N transistor is shortest, is reduced.

Thereby, the ESD breakdown can be prevented because the current at the snapback start does not concentrate at a point and is dispersed in a line configuration along the portion A surrounding the first portion 11a at the junction portion between the second semiconductor portion 12 and the first semiconductor portion 11, and the power per unit area does not become large.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a first semiconductor portion of a first conductivity type;
a second semiconductor portion provided on the first semiconductor portion, the second semiconductor portion being of a second conductivity type and contacting the first semiconductor portion;
a third semiconductor portion provided on the first semiconductor portion, the third semiconductor portion being of the second conductivity type and having a lower second-conductivity-type impurity concentration than the second semiconductor portion;
a fourth semiconductor portion provided on the third semiconductor portion, the fourth semiconductor portion being of the first conductivity type and contacting the third semiconductor portion;
a fifth semiconductor portion provided on the first semiconductor portion, the fifth semiconductor portion being of the first conductivity type;
a sixth semiconductor portion provided on the fifth semiconductor portion, the sixth semiconductor portion being of the second conductivity type and contacting the fifth semiconductor portion;
a seventh semiconductor portion provided on the sixth semiconductor portion, the seventh semiconductor portion being of the second conductivity type and having a higher second-conductivity-type impurity concentration than the sixth semiconductor portion;
an eighth semiconductor portion provided between the first semiconductor portion and the third semiconductor portion, the eighth semiconductor portion being of the second conductivity type, contacting the first semiconductor portion, and having a lower second-conductivity-type impurity concentration than the second semiconductor portion;
a ninth semiconductor portion provided on the second semiconductor portion, the ninth semiconductor portion being of the second conductivity type, surrounding a periphery of the third semiconductor portion and a periphery of the fourth semiconductor portion, and having a higher second-conductivity-type impurity concentration than the third semiconductor portion;
a tenth semiconductor portion provided on the fifth semiconductor portion, the tenth semiconductor portion being of the first conductivity type and surrounding a periphery of the sixth semiconductor portion and a periphery of the seventh semiconductor portion;
a first electrode contacting the first semiconductor portion; and
a second electrode contacting the fourth semiconductor portion and the seventh semiconductor portion.

2. The device according to claim 1, wherein the second-conductivity-type impurity concentration of the eighth semiconductor portion is greater than the second-conductivity-type impurity concentration of the third semiconductor portion.

3. The device according to claim 1, wherein a contact area between the eighth semiconductor portion and the first semiconductor portion is less than a contact area between the second semiconductor portion and the first semiconductor portion.

4. The device according to claim 1, comprising:
a first diode, a second diode, and a third diode,
the second diode and the third diode being connected in series between the first electrode and the second electrode,
the first diode and a set of diodes including the second and third diodes being connected in parallel between the first electrode and the second electrode,
the first diode including a P-N junction between the fifth semiconductor portion and the sixth semiconductor portion,
the second diode including a P-N junction between the third semiconductor portion and the fourth semiconductor portion, the third diode including a P-N junction between the first semiconductor portion and the second semiconductor portion.

5. The device according to claim 4, wherein the third diode is a zener diode.

6. The device according to claim 4, wherein a P-N junction area of the third diode is greater than a P-N junction area of the first diode and a P-N junction area of the second diode.

7. The device according to claim 1, wherein the second-conductivity-type impurity concentration of the second semiconductor portion is not less than $1\times10^{17}$ and not more than $1\times10^{19}$ (atoms/cm$^3$), and the second-conductivity-type impurity concentration of the eighth semiconductor portion is not less than $5\times10^{13}$ and not more than $1\times10^{15}$ (atoms/cm$^3$).

8. A semiconductor device, comprising:
a first semiconductor portion of a first conductivity type;
a second semiconductor portion provided on the first semiconductor portion, the second semiconductor portion being of a second conductivity type and contacting the first semiconductor portion;
a third semiconductor portion provided on the first semiconductor portion, the third semiconductor portion being of the second conductivity type and having a lower second-conductivity-type impurity concentration than the second semiconductor portion;
a fourth semiconductor portion provided on the third semiconductor portion, the fourth semiconductor portion being of the first conductivity type and contacting the third semiconductor portion;
a fifth semiconductor portion provided on the first semiconductor portion, the fifth semiconductor portion being of the first conductivity type;
a sixth semiconductor portion provided on the fifth semiconductor portion, the sixth semiconductor portion being of the second conductivity type and contacting the fifth semiconductor portion;
a seventh semiconductor portion provided on the sixth semiconductor portion, the seventh semiconductor portion being of the second conductivity type and having a higher second-conductivity-type impurity concentration than the sixth semiconductor portion;
a first electrode contacting the first semiconductor portion; and
a second electrode contacting the fourth semiconductor portion and the seventh semiconductor portion,
the first semiconductor portion including a first portion and a second portion, the first portion contacting the second semiconductor portion and provided under the fourth semiconductor portion, the second portion contacting the second semiconductor portion at a region adjacent to the first portion,
a first-conductivity-type impurity concentration of the first portion being less than a first-conductivity-type impurity concentration of the second portion.

9. The device according to claim 8, further comprising:
a ninth semiconductor portion provided on the second semiconductor portion, the ninth semiconductor portion being of the second conductivity type, surrounding a periphery of the third semiconductor portion and a periphery of the fourth semiconductor portion, and having a higher second-conductivity-type impurity concentration than the third semiconductor portion; and
a tenth semiconductor portion provided on the fifth semiconductor portion, the tenth semiconductor portion being of the first conductivity type and surrounding a periphery of the sixth semiconductor portion and a periphery of the seventh semiconductor portion.

10. The device according to claim 8, comprising:
a first diode, a second diode, and a third diode,
the second diode and the third diode being connected in series between the first electrode and the second electrode,
the first diode and a set of diodes including the second and third diodes being connected in parallel between the first electrode and the second electrode,
the first diode including a P-N junction between the fifth semiconductor portion and the sixth semiconductor portion,
the second diode including a P-N junction between the third semiconductor portion and the fourth semiconductor portion,
the third diode including a P-N junction between the first semiconductor portion and the second semiconductor portion.

11. The device according to claim 10, wherein the third diode is a zener diode.

12. The device according to claim 10, wherein a P-N junction area of the third diode is greater than a P-N junction area of the first diode and a P-N junction area of the second diode.

13. The device according to claim 8, wherein the second-conductivity-type impurity concentration of the second semiconductor portion is not less than $1\times10^{17}$ and not more than $1\times10^{19}$ (atoms/cm$^3$), and the second-conductivity-type impurity concentration of the eighth semiconductor portion is not less than $5\times10^{13}$ and not more than $1\times10^{15}$ (atoms/cm$^3$).

14. The device according to claim 1, wherein the second semiconductor portion is an annular region, and the eighth semiconductor portion is a circular region within the annular region of the second semiconductor portion.

15. The device according to claim 1, wherein the eighth semiconductor portion is provided under the fourth semiconductor portion.

* * * * *